United States Patent

Neary et al.

[19]

[11] Patent Number: 6,016,357
[45] Date of Patent: Jan. 18, 2000

[54] FEEDBACK METHOD TO REPAIR PHASE SHIFT MASKS

[75] Inventors: Timothy E. Neary, Essex Junction; Edward W. Conrad, Jeffersonville; Orest Bula, Shelburne, all of Vt.

[73] Assignee: International Business Machines Corporation, Armonk, N.Y.

[21] Appl. No.: 08/876,931

[22] Filed: Jun. 16, 1997

[51] Int. Cl.$^7$ .............................. G06K 9/00; G03F 9/00
[52] U.S. Cl. .............................. 382/144; 430/5; 430/30; 430/311
[58] Field of Search .................................. 382/144, 147, 382/141, 145, 149, 151–152; 430/5, 20, 22, 30, 311; 356/237.1, 237.2, 237.3, 237.4, 237.5; 364/488; 348/86–87, 125–126

[56] References Cited

U.S. PATENT DOCUMENTS

| | | |
|---|---|---|
| 4,906,326 | 3/1990 | Amemiya et al. ........................ 156/626 |
| 5,085,957 | 2/1992 | Hosono ....................................... 430/5 |
| 5,246,804 | 9/1993 | Furukawa et al. ......................... 430/20 |
| 5,273,849 | 12/1993 | Harriott et al. .............................. 430/5 |
| 5,318,869 | 6/1994 | Hashimoto et al. .......................... 430/5 |
| 5,382,484 | 1/1995 | Hosono ....................................... 430/5 |
| 5,443,931 | 8/1995 | Watanabe .................................... 430/5 |
| 5,468,337 | 11/1995 | Miyatake .................................. 216/24 |
| 5,795,685 | 8/1998 | Liebmann et al. ........................... 430/5 |
| 5,795,688 | 8/1998 | Burdorf et al. .......................... 382/144 |
| 5,801,954 | 9/1998 | Le et al. ...................................... 430/5 |
| 5,849,440 | 12/1998 | Lucas et al. ................................ 430/5 |

FOREIGN PATENT DOCUMENTS

| | | |
|---|---|---|
| 0627 664 A1 | 6/1994 | European Pat. Off. . |
| 5005979 | 1/1993 | Japan . |
| 6282064 | 10/1994 | Japan . |

OTHER PUBLICATIONS

*Elimination of Mask Substrate Defects,* IBM Technical Disclosure Bulletin, vol. 26, No. 7B, Dec. 1983—R. L. West.

*Method of Producing Defect–Free Transmission Masks,* IBM Technical Disclosure Bulletin, vol. 27, No. 8, Jan. 1985—U. Behringer, W. Kulcke, P. Nehmiz and W. Zapka.

*Repair System for Phase Shift Masks,* IBM Technical Disclosure Bulletin, vol. 36, No. 05, May 1993.

*Method for Repairing a Short Defect After The Forming Process of A Passivation Layer,* IBM Technical Disclosure Bulletin, vol. 39, No. 02, Feb. 1996.

*Repair Technique for Eleiminating Discontinuities In Patterned Metallurgy* TDBS, by R. Hammer, Sep. 1977, p. 1596.

*Method For Repairing Hard Mask,* by N. Chand, Sep. 1972, TDBS Sep. 1972, p. 1345.

*Primary Examiner*—Leo H. Boudreau
*Assistant Examiner*—Bhavesh Mehta
*Attorney, Agent, or Firm*—DeLio & Peterson, LLC; Peter W. Peterson; Howard J. Walter, Jr.

[57] ABSTRACT

A method of repairing a semiconductor phase shift mask comprises first providing a semiconductor mask having a defect and then illuminating the mask to create an aerial image of the mask. Subsequently, the aerial image of the mask is analyzed and the defect in the mask is detected from the aerial image. An ideal mask image is defined and compared to the aerial image of the defective mask to determine the repair parameters. Unique parameters for repairing the mask defect are determined by utilizing the aerial image analysis and a look-up table having information on patch properties as a function of material deposition parameters. The mask is then repaired in accordance with the parameters to correct the mask defect. A patch of an attenuated material may be applied to the mask or a predetermined amount of material may be removed from the mask. The aerial image of the repair is analyzed to determine whether the repair sufficiently corrects the defect within predetermined tolerances.

23 Claims, 7 Drawing Sheets

FEEDBACK METHOD TO REPAIR PHASE SHIFT MASKS

BACKGROUND OF THE INVENTION

1. Field of the Invention

The present invention relates to a method of repairing a mask for use in lithographic manufacturing of semiconductors and in particular, to a method of repairing phase shift transmission masks.

2. Description of Related Art

Photolithography processes for producing semiconductors and the like utilize masks which are formed by deposition of materials opaque to the light or energy source to be utilized in a desired pattern on a substrate which is generally transparent to such light or energy source (hereinafter referred to generally as light). The mask pattern is transferred via spatially modulated light to create an aerial image which is transferred to a resist film on a substrate. After being exposed to the pattern, the resist film is contacted with a developer and subsequently an etchant to create the desired structure on the substrate.

As a consequence, any defects present on the mask may be transferred onto the substrate and result in defects in the final desired structure. Materials such as chromium, chromium oxide, tungsten and nickel are typically used for photo masks and formed in layer thicknesses of appropriately 500 angstroms to 1000 angstroms on a transparent substrate, such as a quartz glass substrate.

Phase shift masks also utilize additional transparent layers applied to the mask to apply a phase difference of 1800 to the light being transmitted. When used on alternate transparent areas of the mask, such phase shifters reduce the minimum pattern resolution substantially, as compared to the photo mask method.

Methods of repairing mask used to produce semiconductors have been described in the prior art for example, as U.S. Pat. Nos. 5,318,869, 5,246,804, and 4,906,326. In particular, the prior art discloses various methods of adding or removing material from a mask to repair defects, such as in U.S. Pat. Nos. 5,468,337, 5,443,931, 5,382,484, 5,273,849, and 5,080,597. In particular, the '337, '391, '484 and '957 patents relate to repair of phase shift masks.

Despite the numerous prior art in this area, known methods of repairing phase shift masks utilize time consuming trial and error methods of adding the materials required to effect the repairs to the mask itself.

Bearing in mind the problems and deficiencies of the prior art, it is therefore an object of the present invention to provide a method and system for repairing semiconductor masks, including phase shift masks, wherein trial and error techniques are not utilized.

It is another object of the present invention to provide a method or system of repairing such masks by providing a methodology that allows the matching of patch parameters to the desired repair area to ensure a quality repair process.

It is a further object of the invention to provide a method and system for repairing masks which reduces misalignment, overlap geometry transmission and phase errors in patches added to the mask.

Still other objects and advantages of the invention will in part be obvious and will in part be apparent from the specification.

SUMMARY OF THE INVENTION

The above and other objects, which will be apparent to one of ordinary skill in the art, may be achieved by the present invention which relates to a method of repairing a semiconductor mask, for example, a phase shift mask, comprising first providing a semiconductor mask having a defect and then illuminating the mask to create an aerial image of the mask. Subsequently, the method provides for analyzing the aerial image of the mask and detecting the defect in the mask from the aerial image. The method then provides for determining unique parameters for repairing the mask defect utilizing the aerial image analysis and repairing the mask in accordance with the parameters to correct the mask defect.

The method may comprise applying a patch of an attenuated material to the mask or removing a predetermined amount of material from the mask. If a patch is to be added, the method preferably involves removing mask material adjacent to the defect and applying a patch to the mask at the area of removed material. Additionally, the method may further include the step of analyzing the aerial image of the repair and determining whether the repair sufficiently corrects the defect within predetermined tolerances.

In a preferred embodiment, the method further includes the step of providing a look-up table having information on patch properties as a function of material deposition parameters and utilizing information from the look-up table to determine unique parameters for repairing the mask defect. Also, the method preferably includes analyzing the aerial image by defining an ideal mask image and comparing the ideal mask image to the aerial image of the defective mask to determine the repair parameters. The aerial image of the mask and defect may be analyzed by defining a constant intensity contour of the aerial image corresponding to a predetermined value required to print the aerial image in a lithographic process. Further, the method may include determining the difference in area between the ideal mask image and the aerial image of the defective mask. Information on patch properties may be utilized from the look-up table to calculate a theoretical aerial image of a patch and determining whether the theoretical patch sufficiently corrects the defect within predetermined tolerance until the unique patch parameters are determined.

In another aspect, the present invention relates to an apparatus for repairing a semiconductor mask comprising means for illuminating a semiconductor mask having a defect to create an aerial image of the mask; means for analyzing the aerial image of the mask; means for detecting the defect in the mask from the aerial image; means for determining unique parameters for repairing the mask defect utilizing the aerial image analysis; and means for repairing the mask in accordance with the parameters to correct the mask defect. Preferably, the apparatus further includes a look-up table having information on patch properties as a function of material deposition parameters and wherein the determining means includes means for utilizing information from the look-up table.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
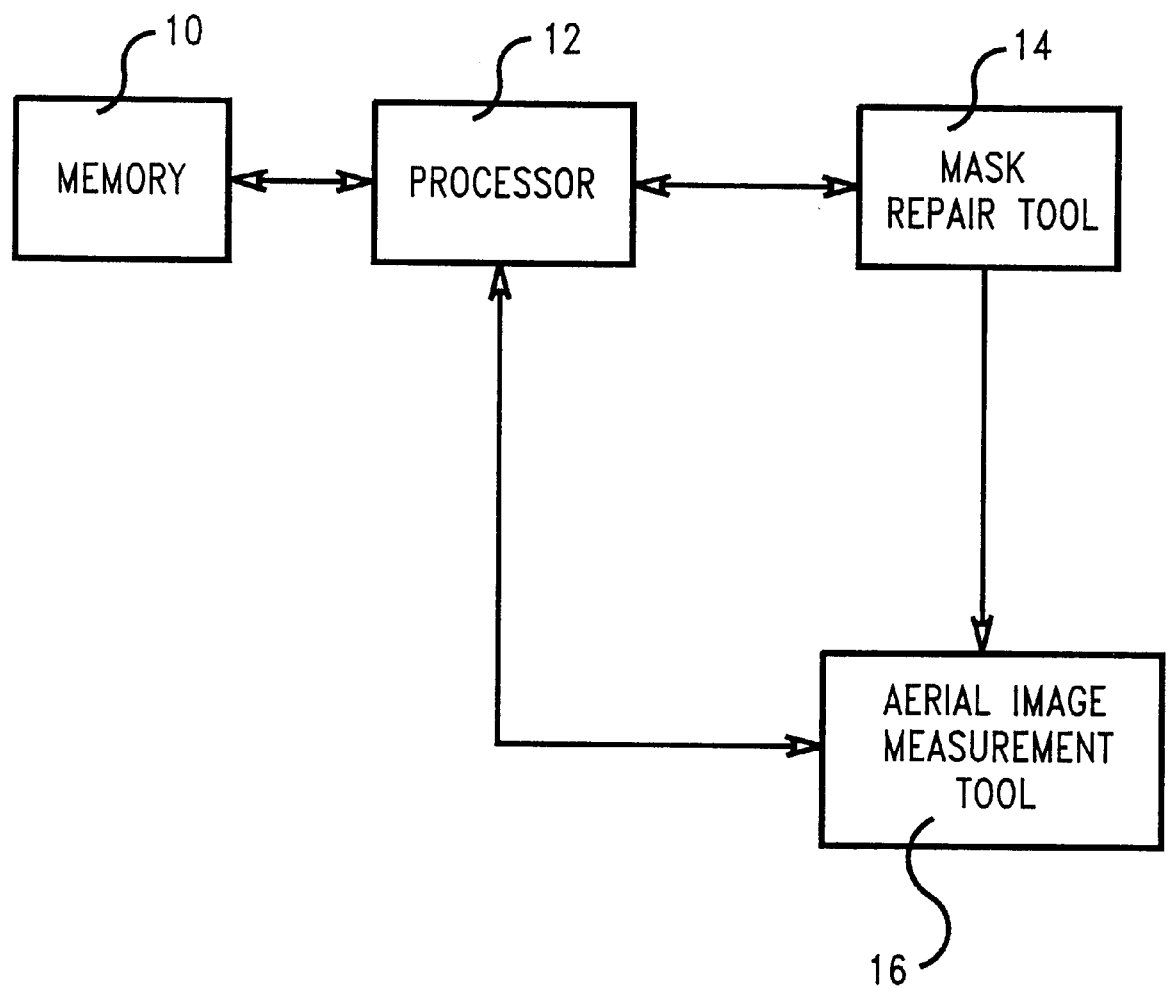
FIG. 1 is a schematic of the preferred system utilized in the present invention.

In describing the preferred embodiment of the present invention, reference will be made herein to FIGS. 1–17 of the drawings in which like numerals refer to like features of the invention. Features of the invention are not necessarily shown to scale in the drawings.

The system utilized in practicing the method of the present invention is depicted in FIG. 1. A mask repair tool is depicted at 14, for example, the repair tool sold by Excel/Quantronix Corp. as DRS model 850. This repair tool preferably comprises ablation and deposition capabilities for chromium and molybdenum silicide. It is also capable of defining various deposition compositions. These deposition compositions will have unique composition and phase characteristics and are repeatable.

Also employed is a device 16 to measure the intensity of the aerial image created by illuminating the mask with the desired light source. A preferred aerial image measurement device is the Microlithography Simulation Microscope 100 AIMS (Aerial Image Measurement Software), version 1.1 system sold by Carl Zeiss Inc. which emulates an optical lithography tool. The device includes apertures that can emulate commercially available printing tools (e.g., Nikon EXX and Microscan II and III) and has is the ability to use the working wavelength of the light to be employed (248 and 365 nanometers).

The aerial image measurement device should preferably, provide intensity values over the entire aerial image and provide information as to whether the aerial image will print by measuring the intensity of each point of the image.

As further depicted in FIG. 1, there is also provided a microprocessor controller 12 and system memory 10. To initially set up the system, the controller 12 is utilized to first create a data base of information on patch properties as a function of material deposition parameters in the mask repair tool 14. This information is then stored in the system memory 10. Subsequently, the controller 12 is utilized to analyze the aerial image intensity from the aerial image measurement tool 16 and determine the stored patch parameters necessary to match and repair a defect detected by the processor. The controller 12 then provides instruction to the mask repair tool 14 to apply the required patch to repair the mask defect. The controller 12 then subsequently analyzes the aerial image of the repaired mask received from the aerial image measurement tool 16 to determine whether the repair is within predetermined acceptable tolerance values.

Figure 2:
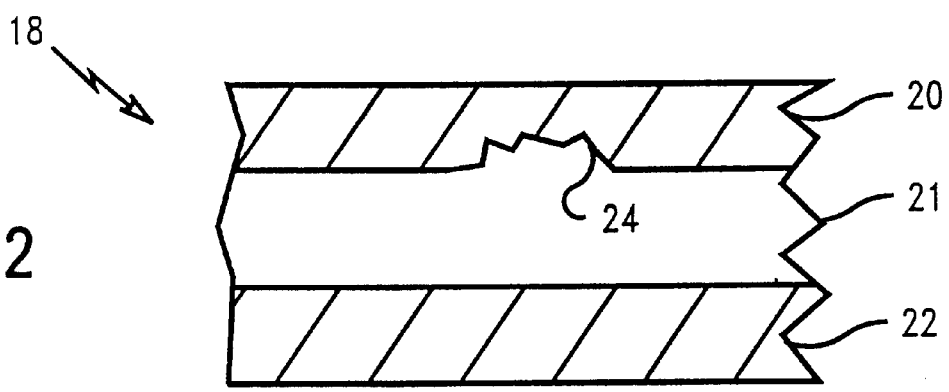
FIG. 2 is a top plan view of a mask having a defect on a portion of an opaque line.
Figure 3:
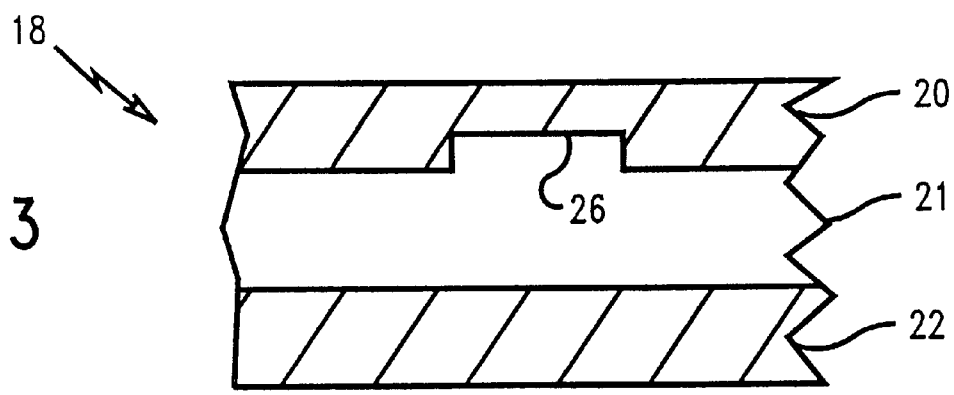
FIG. 3 is a top plan view of a mask of FIG. 2 with the defect cut out.
Figure 4:
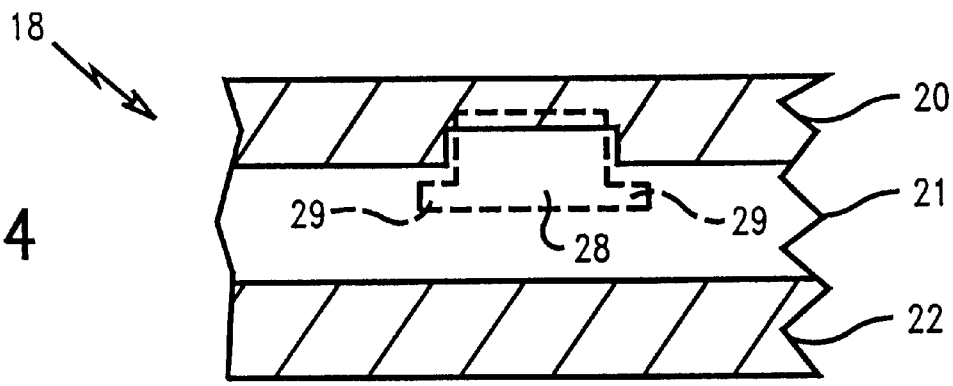
FIG. 4 is a top plan view of a mask of FIG. 2 with the defect repaired in accordance with the present invention by adding a patch.

In a first series of examples shown in FIGS. 2–4, there is shown a portion of a phase shift mask 18 made up of a pair of parallel lines 20, 22 opaque to the light energy employed which are deposited on substrate 21 transparent to the light energy employed. On opaque line 20 there is depicted a defect 24 as shown by the absence of material from a portion of the line 20 (FIG. 2). The presence and configuration of defect 24 is measured by the aerial image measurement device.

In FIG. 3, there is shown an optional step of cutting away the ragged portion of the defect 24 (FIG. 2) to create a substantially planar, rectangular trimmed section 26 in opaque line 20.

Following analysis of the defect 24 (FIG. 2) or trimmed defect area 26 (FIG. 3) by the aerial image measurement device and microprocessor, and determination of the patch parameters (to be described further below), there is shown in FIG. 4 the application of a repair patch 28 to the affected area of the defect in opaque line 20. Repair patch 28 is selected to add material of predetermined transmission level, phase shift, thickness, geometry and overlap to fully patch and repair the defect in accordance with well-known methods. Because of differences in transmission, phase shift and other properties between mask and patch materials, a repair patch need not, and likely will not, have the exact transmission level, phase shift, thickness and geometry of the defective area to be repaired. The patch 28 may be smaller or larger than the defective area 24 or trimmed area 26. Additionally, corners or anchors 29 of patch material may extend from the patch into clear areas. These anchors 29 provide optical proximity correction (OPC) to permit better blending of the patch into the mask to improve the quality of the aerial image of the repair patch.

Figure 5:
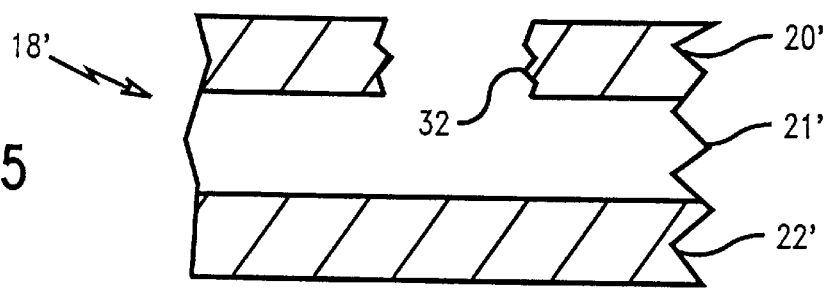
FIG. 5 is a top plan view of another mask having a defect through an opaque line.
Figure 6:
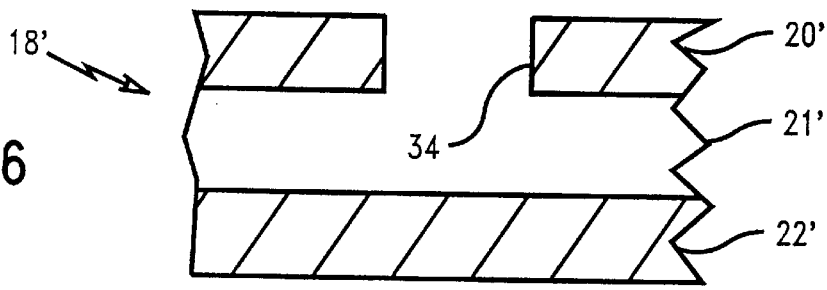
FIG. 6 is a top plan view of a mask of FIG. 5 with the defect cut out.
Figure 7:
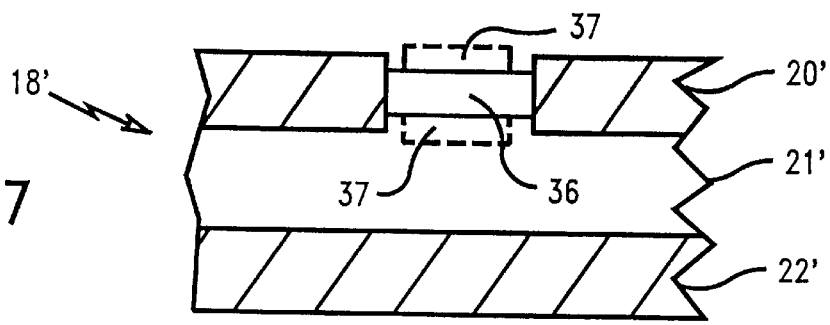
FIG. 7 is a top plan view of a mask of FIG. 5 with the defect repaired in accordance with the present invention by adding a patch.

While FIGS. 2–4 show the detection, trimming and repair of a defect partially through an opaque line, FIGS. 5, 6 and 7 show a comparable detection repair and patching of a defect which extends entirely through an opaque line. In FIG. 5, there is shown a defect 32 which extends completely through opaque line 20' on transparent substrate 21' of phase shift mask 18'. In FIG. 6 there is depicted the trimming of the defect area to create a rectangular, planar surface 34 in the region of the defect in opaque line 20'. In FIG. 7, after the analysis of the defect 32 or trimmed area 34, there is applied a patch 36 to the afflicted area of opaque line 20'. As with the patch of FIG. 4, there may also be provided OPC anchors 37 on patch 36 to improve the repair patch aerial image.

Figure 8:
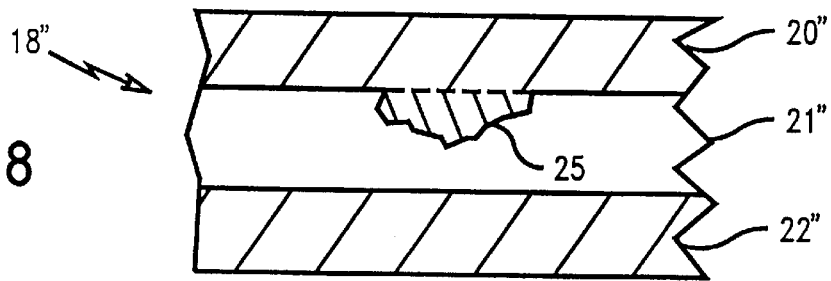
FIG. 8 is a top plan view of a mask having a defect extending outward from a portion of an opaque line.
Figure 9:
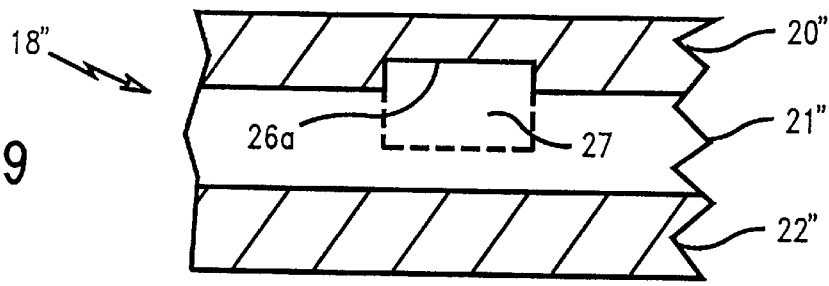
FIG. 9 is a top plan view of the mask of FIG. 8 which has been repaired by ablating mask material.

The present invention also includes repair of a defect by ablation or removal of material from the mask, if such removal facilitates correction of the defect. As shown in FIG. 8, a defect 25 extends outward of opaque line 20" on transparent substrate 21" of phase shift mask 18". After the analysis of the defect in accordance with the present invention, area 25 is trimmed to correct the mask and make the repair. As shown in FIG. 9, the defective excess area 25 has been trimmed away, along with a portion 26a of the mask opaque line 20". Since there is always a possibility of damage to the transparent quartz substrate 21", the remaining ablated area 27 may be tailored by material and area of ablation to the desired repair parameters.

In determining the parameters for patching or ablating defects in mask, there must be considered degree of transmission (T) of the mask, as well as the degree of phase shift ($\phi$) of the mask. Also, there must be considered the transmission of the patch ($T_p$) as well as the phase shift of the patch ($\phi_p$). Other parameters to be considered are the geometry of the defect, the type of patch material utilized, the geometry of the repair patch, and the desired output of the transmission after repair.

The operation of the method of the present invention will now be described. Initially, a look-up table is prepared and stored in the system memory 10. The look-up table contains information on patch properties as a function of material deposition parameters. The values of the lookup table are developed by operating the mask repair tool 14 at different flow rates, mixtures and times for various different patch materials the tool is capable of depositing on a mask. The controller 12 stores the material deposition process parameters for the sample patches. Subsequently, the different samples of repair patches created by the mask repair tool may be analyzed by the aerial image measurement tool 16 and by other methods, including step height measurement (e.g., with a Tencor P 11 step measurement system) and phase difference relative to quartz (e.g., with a Laser Tech phase measurement tool) to determine the patch material thickness, light transmission value, light phase shift, and other desired parameters. Finally, the material property parameters are matched to the deposition process parameters for each sample in the system memory 10. The look-up table also contains material property parameters for the materials used to create lines and other attenuating materials on a mask, such that removal or ablation of mask materials may be analyzed for material thickness, light transmission value, light phase shift, and other desired parameters. Subsequently, the controller is able to identify material deposition or ablation process parameters for the mask repair tool for each material property parameter desired in a look-up table in the database created in the system memory.

Figure 10:
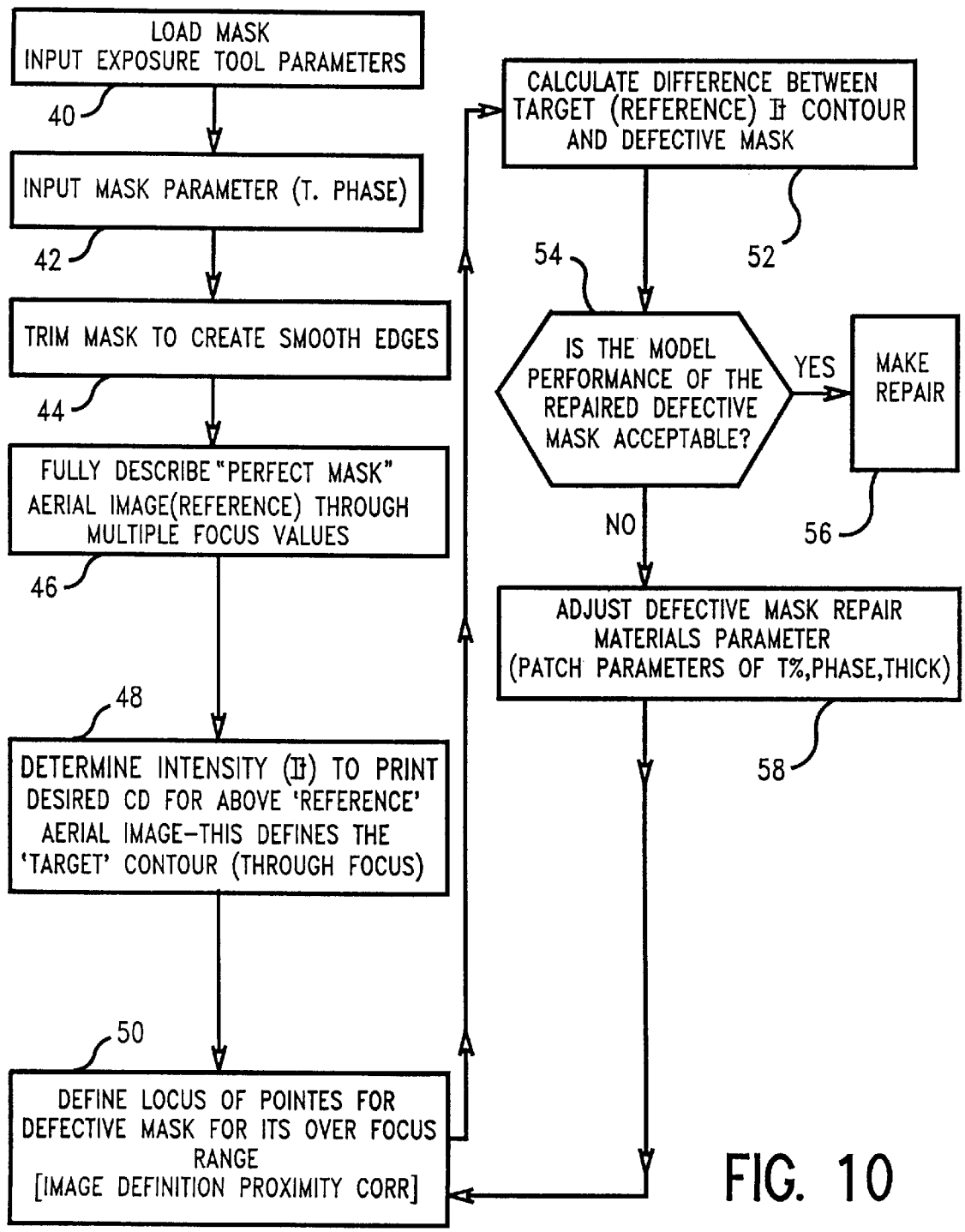
FIG. 10 is a schematic of the preferred repair method utilized in accordance with the present invention.

After a look-up table is created, a phase shift mask may then be mounted in the repair tool which is connected to the aerial image measurement tool so that a systematic solution can be applied by means of software or instructions for the microprocessor controller 12. Turning to FIG. 10, the feedback method to repair phase shift masks is described in more detail. In first step 40, the mask is loaded into the repair/aerial image measurement tool and the input exposure tool parameters are established for the aerial image measurement tool. The aerial image measurement tool should utilize the same exposure tool parameters such as numerical aperture and sigma aperture to determine light coherence. Next, as shown by box 42, the mask parameters (T,$\phi$) are inputted into the controller 12 so as to determine the proper difference between the quartz substrate and the attenuating film patterns on the substrate.

The aerial image created by the mask describes the light intensity in three dimensional space that is produced by projecting the mask image or object to the image plane, which in use in lithographic manufacturing is the wafer plane. Although the aerial image extends throughout a large region of space, the portion of the aerial image that has the greatest importance is in the vicinity of the printed image edge. One method of characterizing the aerial image is the intensity-to-print, or $I_t$, which may be characterized by different known measures of aerial image quality. A preferred method in the present invention is the threshold method which utilizes constant image contours to predict the printed image shape simply and effectively. With this method, a value of It is defined as the intensity-to-print and the constant image contour corresponding to $I_t$ is defined as the approximation of the printed image. $I_t$ is selected based on the critical dimension (CD) of the shape of interest which, for the simple case of lines and spaces, is generally the line width.

Figure 12:
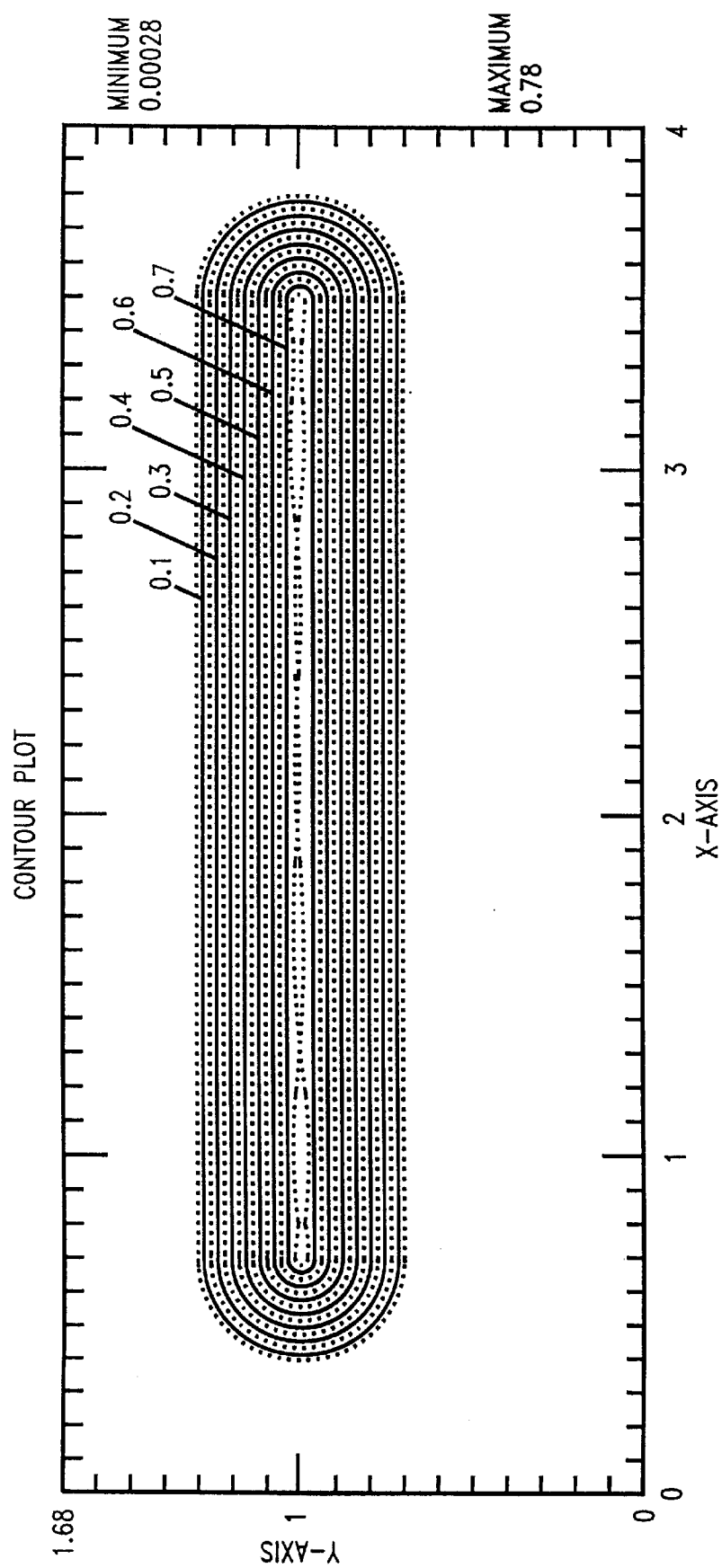
FIG. 12 is a contour plot of the aerial image of the mask image of FIG. 11.
Figure 11:
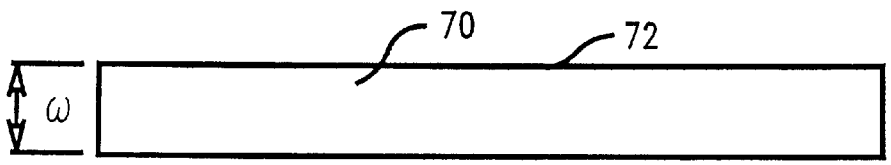
FIG. 11 is a top plan view of a defined (perfect) mask image.
Figure 13:
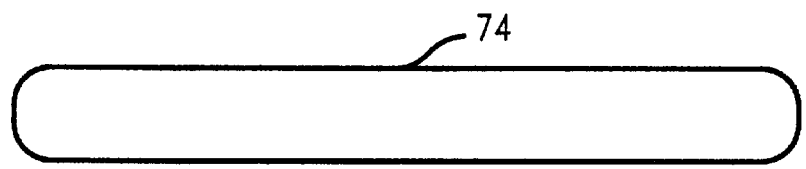
FIG. 13 depicts a constant intensity contour of the mask image of FIG. 11.

An example of a defined (perfect) mask image is shown in FIG. 11 as line 70 having an image edge 72 with width w of 0.36 $\mu$m. In FIG. 12 there is shown the contour plot of the aerial image of line 70 as it would appear at the wafer plane (0 defocus). FIG. 13 depicts the contour 74 associated with an $I_t$ of 0.32, which has a width of 0.36 $\mu$m and conforms to the actual width of line 70.

Figure 14:
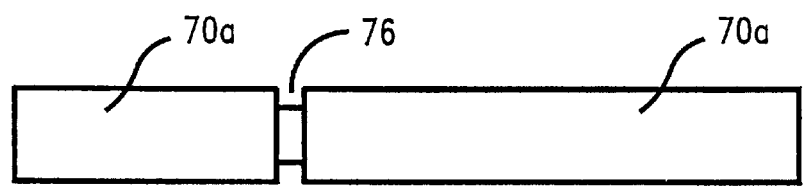
FIG. 14 is a top plan view of a mask line having a defect of missing material at a mid-point.
Figure 15:
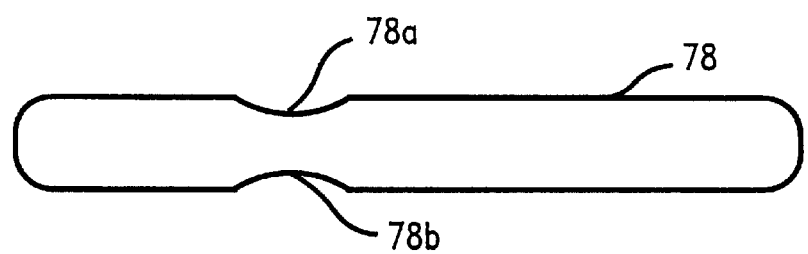
FIG. 15 depicts a constant intensity contour of the mask line of FIG. 14.

FIG. 14 depicts a mask line 70a having a defect of missing material 76 at a mid-point. In FIG. 15 there is shown the aerial image contour 78 of mask line 70a, corresponding to an $I_t$ of 0.32, which shows the contour deviations 78a and 78b corresponding to defective area 76.

Returning to FIG. 10, after transmission of the attenuated film on the mask is measured and the mask defect is detected, the mask is optionally trimmed (box 44) by the repair tool to create smooth edges around the defect area. The defect may also be repaired without trimming.

Next, as shown by box 46, the aerial image measurement tool emulates the exposure tool upon which the mask is to be used by stepping the mask image transmission through multiple focus values, which are dependent upon the topography of the semiconductor wafer (substrate) to be processed. While this is occurring, the controller fully describes the ideal mask required to produce the desired ideal mask aerial image on the wafer. This is achieved by using a simulator to predict the ideal aerial image, for example, in the case of grouped or isolated lines, by superimposing straight lines separated by the design CD.

Next, in step 48, the intensity ($I_t$) is determined to print the desired CD for the referenced ideal aerial image. This defines the target contour created by the ideal aerial image through the various focus values, as described above. The intensity at which the contours are separated by the design CD may be designated as $I_t$.

Thereafter, as shown by box 50, the controller defines the actual locus of points for the defective mask for intensity over the focus range, as described in connection with FIGS. 11–15. This defines the image definition proximity correction. If the defect has been trimmed, the contours of the trimmed area are utilized.

Figure 16:
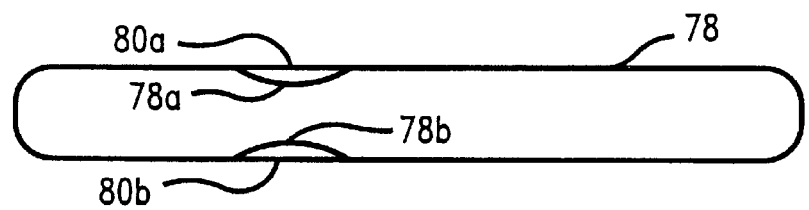
FIG. 16 depicts a combination of the constant intensity contour of the mask image of FIG. 11 and the constant intensity contour of the mask line of FIG. 14.
Figure 17:
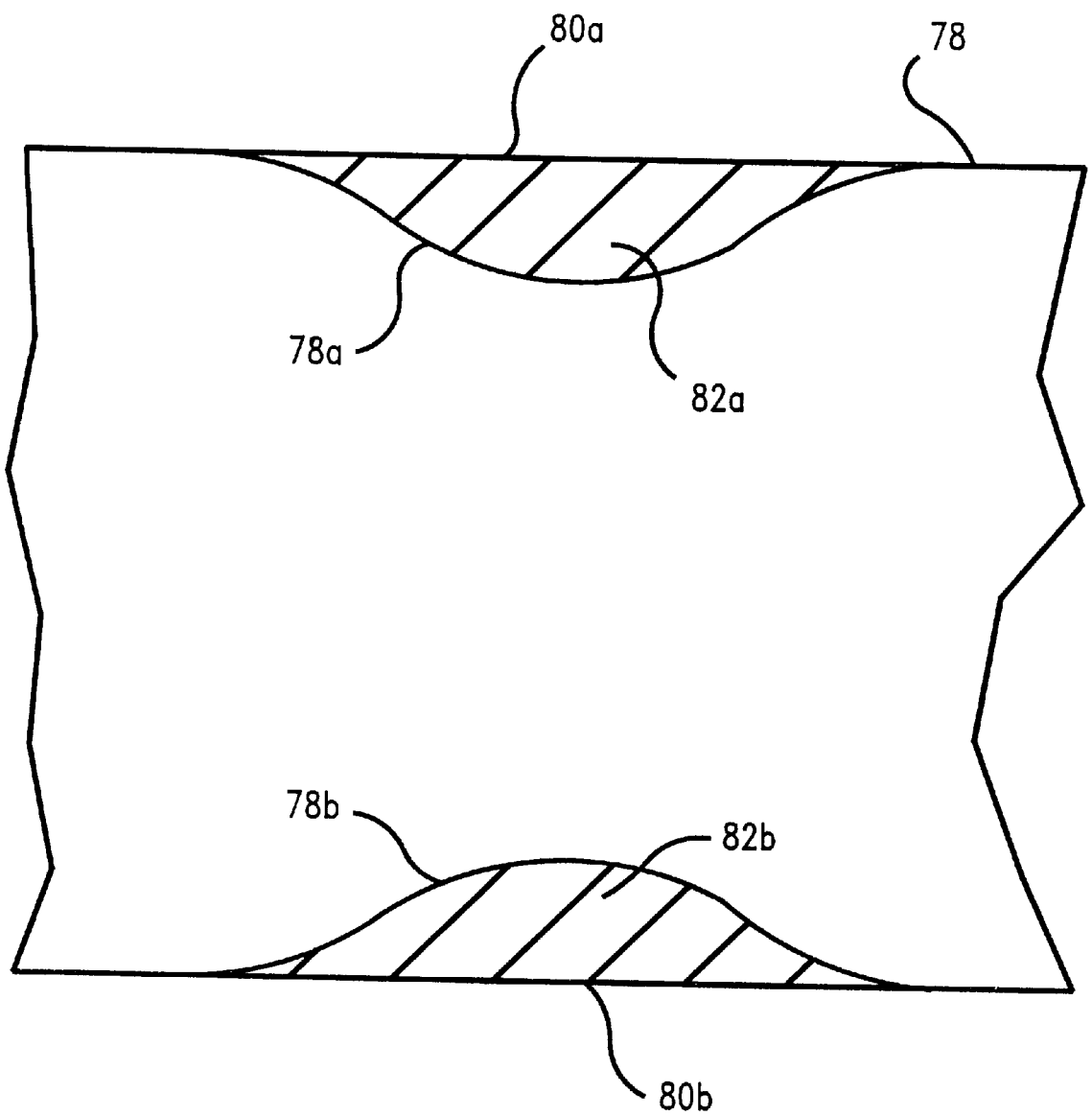
FIG. 17 is an enlarged view of a portion of FIG. 16.

Next, as depicted by box 52, the controller calculates the difference between the ideal aerial image target intensity contour, and the defective mask intensity contour. In FIG. 16 the aerial image contour 78 with defect deviations 78a, 78b, is reproduced along with an overlay of ideal or perfect contours 80a and 80b which would be produced if the mask were not defective. An enlarged view of the defective areas is shown in FIG. 17. Defective area 82a lies between actual contour 78a and ideal contour 80a, while defective area 82b lies between actual contour 78b and ideal contour 80b. To calculate the difference, the controller calculates the square of the area (82a, 82b) between the ideal and defective aerial image contour.

The controller then cycles through the patch material parameters of transmission, phase and thickness in the lookup table in the system memory 10 to determine which patch would be optimal to adjust the defective area and repair the mask. The controller may also utilize look-up table information to determine whether mask material removal would correct the defect. A wide range of metrics (parameters) may be used for this and possibly more than one series of calculation may be done simultaneously. Preferably, the software determines ranges of the optimal patch size, geometry and material parameters of transmission and phase appropriate to the mask repair tool to match the aerial image required. Additionally, the software defines the repaired feature edges and may include optical proximity correction features, as described above, if required.

As depicted by box 54 (FIG. 10), the controller then determines whether the modeled performance of the repaired defective mask is acceptable. The controller does so by comparing the modeled performance intensity for each point of the aerial image to predetermined tolerances established for each such point in order to process the wafer within established limits. If the calculated performance of the repaired mask is acceptable (box 56), the controller 12 downloads the material deposition process parameters associated with the calculated patches and instructs the mask repair tool 14 to apply the calculated patches to the mask using such deposition parameters. These deposition parameters establish gas flow rates, gas fixtures, time of deposition and other typical process parameters to deposit the patches in the defect area.

On the other hand, if the modeled performance of the repaired defect mask is not acceptable (box 58), the controller continues to iterate through the variable parameters, adjusts the defective mask repair parameters such as transmission percentage, phase shift, thickness and the like and returns to box 50 to redefine the locus of points for the defective mask. The process is also performed through various focus values to ensure consistent aerial image integrity through the focus range required to manufacture the desired wafer. The process then continues until the variable parameters achieve a minimum in the square of the area between the It contours of the ideal and simulated repaired mask. Once the modeled performance is within acceptable tolerances, the repair is made by the mask repair tool. Finally, the present invention also contemplates the steps of analyzing the aerial image of the repair patch or material removal and determining whether the patch or removed material sufficiently corrects the defect within predetermined tolerances.

The present invention may be used to add or remove either opaque or transparent attenuating film material to repair defects in the mask. This method allows for optimization of each repair that is made. Each repair that is made is unique and each attenuating film patch or ablation will be optimized to the defect under repair.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of repairing a semiconductor mask comprising the steps of:
   a) providing a semiconductor mask having a defect;
   b) illuminating said mask to create an aerial image of said mask;
   c) analyzing said aerial image of said mask including degree of transmission and degree of phase shift of said mask;
   d) detecting said defect in said mask from said aerial image;
   e) determining unique parameters for repairing said mask defect utilizing the aerial image analysis including degree of transmission and degree of phase shift of a repair; and
   f) repairing said mask in accordance with said parameters to correct said mask defect.

2. The method of claim 1 wherein step (f) comprises applying a patch of an attenuated material to said mask.

3. The method of claim 1 wherein step (f) comprises removing a predetermined amount of material from said mask.

4. The method of claim 1 further including, prior to step (f), the step of removing mask material adjacent to said defect and wherein step (f) comprises applying a patch to said mask at the area of removed material.

5. The method of claim 1 further including the step of analyzing the aerial image of the repair and determining whether the repair sufficiently corrects said defect within predetermined tolerances.

6. The method of claim 1 wherein step (c) includes analyzing the aerial image by defining an ideal mask image and step (d) includes comparing the ideal mask image to the aerial image of said mask created in step (b).

7. The method of claim 6 wherein said aerial image of step (b) is analyzed in step (c) by defining a constant intensity contour of said aerial image corresponding to a predetermined value required to print said aerial image in a lithographic process.

8. The method of claim 6 wherein step (c) includes determining the difference in area between the ideal mask image and the aerial image of said mask created in step (b).

9. A method of repairing a semiconductor phase shift mask comprising the steps of:
   a) providing a semiconductor phase shift mask having a defect;
   b) illuminating said mask to create an aerial image of said mask;
   c) analyzing said aerial image of said mask;
   d) detecting said defect in said mask from said aerial image;
   e) providing a look-up table having information on patch properties;
   f) determining unique attenuating patch parameters for repairing said mask defect utilizing the aerial image analysis and information from said look-up table; and
   g) applying to said mask an attenuating patch corresponding to said parameters to repair said mask defect.

10. The method of claim 9 wherein step (c) includes analyzing the aerial image by defining an ideal mask image and step (d) includes comparing the ideal mask image to the aerial image of said mask created in step (b).

11. The method of claim 10 wherein said aerial image of step (b) is analyzed in step (c) by defining a constant intensity contour of said aerial image corresponding to a predetermined value required to print said aerial image in a lithographic process.

12. The method of claim 11 wherein step (c) includes determining the difference in area between the ideal mask image and the aerial image of said mask created in step (b).

13. The method of claim 12 wherein step (f) includes utilizing information on patch properties from said look-up table to calculate a theoretical aerial image of a patch and determining whether the theoretical patch sufficiently corrects said defect within predetermined tolerance until the unique patch parameters are determined.

14. A method of repairing a semiconductor phase shift mask comprising the steps of:
   a) providing a semiconductor phase shift mask having a defect;
   b) illuminating said mask to create an aerial image of said mask;
   c) analyzing said aerial image of said mask including degree of transmission and degree of phase shift of said mask;
   d) detecting said defect in said mask from said aerial image;
   e) providing a look-up table having information on mask material properties;
   f) determining unique parameters for repairing said mask defect utilizing the aerial image analysis including degree of transmission and degree of phase shift of a repair; and
   g) removing a predetermined amount of material from said mask in accordance with said parameters to correct said mask defect.

15. The method of claim 14 wherein step (c) includes analyzing the aerial image by defining an ideal mask image and step (d) includes comparing the ideal mask image to the aerial image of said mask created in step (b).

16. The method of claim 15 wherein said aerial image of step (b) is analyzed in step (c) by defining a constant intensity contour of said aerial image corresponding to a predetermined value required to print said aerial image in a lithographic process.

17. The method of claim 16 wherein step (c) includes determining the difference in area between the ideal mask image and the aerial image of said mask created in step (b).

18. An apparatus for repairing a semiconductor mask comprising:
   means for illuminating a semiconductor mask having a defect to create an aerial image of said mask;
   means for analyzing said aerial image of said mask including degree of transmission and degree of phase shift of said mask;
   means for detecting said defect in said mask from said aerial image;
   means for determining unique parameters for repairing said mask defect utilizing the aerial image analysis including degree of transmission and degree of phase shift of a repair; and
   means for repairing said mask in accordance with said parameters to correct said mask defect.

19. A method of repairing a semiconductor mask comprising the steps of:
   a) providing a semiconductor mask having a defect;
   b) illuminating said mask to create an aerial image of said mask;
   c) analyzing said aerial image of said mask;
   d) detecting said defect in said mask from said aerial image;
   e) providing a look-up table having information on patch properties as a function of material deposition parameters;
   f) determining unique parameters for repairing said mask defect utilizing the aerial image analysis and information from said look-up table; and
   g) repairing said mask in accordance with said parameters to correct said mask defect by applying a patch of an attenuated material to said mask.

20. The method of claim 19 wherein step (f) includes determining the difference in area between an ideal mask image and the aerial image of said mask created in step (b).

21. The method of claim 20 further including utilizing information on patch properties from said look-up table to calculate a theoretical aerial image of a patch and determining whether the theoretical patch sufficiently corrects said defect within predetermined tolerance until the unique patch parameters are determined in step (e).

22. An apparatus for repairing a semiconductor mask comprising:
   means for illuminating a semiconductor mask having a defect to create an aerial image of said mask;
   means for analyzing said aerial image of said mask;
   means for detecting said defect in said mask from said aerial image;
   a look-up table having information on patch properties as a function of material deposition parameters;
   means for determining unique parameters for repairing said mask defect utilizing the aerial image analysis, the determining means including means for utilizing information from said look-up table; and
   means for repairing said mask in accordance with said parameters to correct said mask defect.

23. A method of repairing a semiconductor phase shift mask comprising the steps of:
   a) providing a semiconductor phase shift mask having a defect;
   b) illuminating said mask to create an aerial image of said mask;
   c) analyzing said aerial image of said mask;
   d) detecting said defect in said mask from said aerial image;
   e) providing a look-up table having information on mask material properties;
   f) determining unique parameters for repairing said mask defect utilizing the aerial image analysis and information from said look-up table; and
   g) removing a predetermined amount of material from said mask in accordance with said parameters to correct said mask defect.

* * * * *